(12) United States Patent
Lin et al.

(10) Patent No.: US 7,126,092 B2
(45) Date of Patent: Oct. 24, 2006

(54) HEATER FOR WAFER PROCESSING AND METHODS OF OPERATING AND MANUFACTURING THE SAME

(75) Inventors: Hongy Lin, Chesterfield, MO (US); Yun Wang, Chesterfield, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 11/035,258

(22) Filed: Jan. 13, 2005

(65) Prior Publication Data

US 2006/0151465 A1    Jul. 13, 2006

(51) Int. Cl.
*H05B 3/68* (2006.01)
*C23C 16/00* (2006.01)

(52) U.S. Cl. .................. 219/444.1; 219/390; 118/728

(58) Field of Classification Search ............... 219/390, 219/405, 411, 444.1, 444.3, 445.1, 446.1, 219/448.11, 448.12, 448.17, 451.1
See application file for complete search history.

(56) References Cited

U.S. PATENT DOCUMENTS

| | | | |
|---|---|---|---|
| 4,938,815 A | 7/1990 | McNeilly | |
| 5,039,840 A | 8/1991 | Boardman | |
| 5,231,690 A | 7/1993 | Soma et al. | |
| 5,294,778 A | 3/1994 | Carman et al. | |
| 5,889,261 A | 3/1999 | Boardman | |
| 6,066,836 A | 5/2000 | Chen et al. | |
| 6,222,166 B1 | 4/2001 | Lin et al. | |
| 6,225,608 B1 | 5/2001 | Kallgren | |
| 6,364,954 B1 | 4/2002 | Umotoy et al. | |
| 6,376,811 B1 | 4/2002 | Yamaguchi et al. | |
| 6,423,949 B1 | 7/2002 | Chen et al. | |
| 6,491,757 B1 | 12/2002 | Halpin et al. | |
| 6,639,189 B1 | 10/2003 | Ramanan et al. | |
| 6,646,235 B1 * | 11/2003 | Chen et al. .............. | 219/444.1 |
| 6,736,997 B1 | 5/2004 | Olding et al. | |
| 6,740,853 B1 | 5/2004 | Johnson et al. | |
| 6,744,018 B1 * | 6/2004 | Takano ....................... | 219/390 |
| 6,762,396 B1 | 7/2004 | Abbott et al. | |
| 6,828,032 B1 | 12/2004 | Wielstra et al. | |
| 6,855,916 B1 | 2/2005 | Matthews et al. | |
| 6,875,960 B1 | 4/2005 | Yamaguchi et al. | |
| 6,878,906 B1 | 4/2005 | Ito et al. | |

FOREIGN PATENT DOCUMENTS

| | | |
|---|---|---|
| JP | 05-121342 | 5/1993 |
| JP | 06-077148 | 3/1994 |
| JP | 2002-203797 | 7/2002 |

* cited by examiner

*Primary Examiner*—Joseph Pelham
(74) *Attorney, Agent, or Firm*—Harness, Dickey & Pierce P.L.C.

(57) ABSTRACT

A heater for wafer processing, such as thin film deposition, includes a first heating unit and a second heating unit. The first heating unit includes a substrate with a top surface for supporting a wafer thereon and a back surface. The second heating unit is disposed proximate the back surface of the substrate and is preferably disposed inside an inner space of a shaft supporting the first heating unit in a processing chamber. The first heating unit and the second heating unit are independently controlled. The second heating unit is designed based on the actual temperature profile and heat loss on the top surface. Therefore, the second heating unit can more effectively compensate the heat loss to achieve a more uniform temperature profile on the top surface.

30 Claims, 4 Drawing Sheets

HEATER FOR WAFER PROCESSING AND METHODS OF OPERATING AND MANUFACTURING THE SAME

FIELD OF THE INVENTION

The present invention relates generally to electric heaters, and more particularly to electric heaters with an improved heating/temperature profile for wafer processing and methods of operating and manufacturing the same.

BACKGROUND OF THE INVENTION

Electric heaters for heat-treatment of a workpiece, particularly for wafer processing, are generally known in the art. A typical electric heater for wafer processing generally has a dielectric substrate with a heating surface for heating and supporting a wafer and a resistive heating element embedded inside the substrate. The substrate is generally made of ceramic materials due to, among other things, their high thermal conductivity, which facilitates the heat transfer from the resistive heating element to the heating surface and hence the wafer supported thereon. During processing, thin film deposition is to be performed on the wafer when the wafer is heated by the heater. Since a uniform heating/temperature profile on the heating surface is critical to the quality of the deposited film on the wafer, various attempts have been made to achieve a more uniform heating/temperature profile across the heating surface of the substrate.

It has been found that a high degree of uniform heating can be achieved by, among other things, (1) providing an extreme degree of flatness of the supporting surface of the substrate, (2) selecting a thermally conductive substrate with high thermal conductivity, (3) providing a thermally conductive substrate that has rigidity, stiffness, and thermal properties to achieve the desired flatness and thermal conductivity.

Despite these attempts, it is still difficult to realize a heater with an improved uniform heating/temperature profile. The processes for manufacturing a heater, particularly a ceramic heater, are complex. Factors affecting the performance and quality of a completed ceramic heater during manufacturing include, among other things, the inhomogeneous material properties of the substrate and the non-uniform temperature distribution in the manufacturing environment to which the substrate is exposed. These factors complicate the design and manufacturing aspects of a ceramic heater.

Another problem that complicates the design of a ceramic heater is the occurrence of heat loss during operation. Heat losses generally occur at the periphery and the center of the substrate, and it is difficult to predict the amount of heat losses at a specific operating temperature. If the actual heat losses during operation is greater than a maximum design limit, practically nothing can be done to remedy the situation to achieve a more uniform temperature profile once the heater is completed. As a result, the completed ceramic heater with an unsatisfactory heating/temperature profile is often scrapped, thereby increasing manufacturing costs.

It has been proposed that dividing the substrate into multiple heating zones and independently controlling the temperatures of the multiple heating zones may somehow compensate for the heat loss during operation to maintain a more uniform temperature across the heating surface of the substrate, as proposed in U.S. Pat. No. 6,423,949 ("the '949 patent") to Chen et al. However, the proposed heater cannot deal with the situation where any one of the temperature profiles of the individual heating elements deviates significantly from the design requirements. As with a heater with a single heating zone, the heating elements of the '949 patent are embedded inside the substrate and cannot be removed without destroying the heater. Practically, nothing can be done to achieve a more uniform temperature once a heater is completed if any one of the temperature profiles of the multiple heating zones deviates significantly from the design requirements. Moreover, it is difficult to predict the exact locations and areas where hot spots or heat losses occur as well as their degree. As a result, a heater with multiple heating zones as disclosed in the '949 patent does not make the design and manufacturing of a heater less complex than a heater with a single heating zone.

SUMMARY OF THE INVENTION

In one preferred form, a heater for wafer processing is provided that comprises a first heating unit comprising a substrate and a resistive heating element embedded in the substrate, the substrate having a heating surface for supporting a workpiece and a back surface. The heater also comprises a second heating unit disposed proximate the back surface of the substrate, wherein the first heating unit and the second heating unit are independently controlled.

In another form, a heater for wafer processing is provided that comprises a first heating unit comprising a substrate and a resistive heating element embedded in the substrate. The substrate has a top heating surface and a back surface and a shaft is disposed proximate the back surface of the substrate, wherein the shaft defines an inner space. A second heating unit is disposed proximate the back surface of the substrate and within the inner space of the shaft, wherein the first heating unit and the second heating unit are independently controlled.

In yet another form, a method of operating a heater for wafer processing is provided that comprises the steps of: providing a first heating unit comprising a substrate and a first resistive heating element embedded in the substrate, the substrate having a heating surface and a back surface, the first resistive heating element generating a first temperature profile on the heating surface; providing a second heating unit proximate the back surface of the substrate, the second heating element generating a second temperature profile on the heating surface of the substrate; measuring a combined temperature profile on the heating surface of the substrate, the combined temperature profile defined by a combination of the first temperature profile and the second temperature profile; and adjusting the second temperature profile to achieve a predetermined combined temperature profile on the heating surface.

In yet another form, a method of manufacturing a heater for wafer processing is provided that comprises the steps of: forming a first heating unit by hot pressing, the first heating unit defining a resistive heating element embedded in a substrate; forming a second heating unit by hot pressing, the second heating unit defining a resistive heating element embedded in a substrate; forming a shaft by sintering; and bonding the shaft and the second heating unit to a back surface of the first heating unit, the second heating unit being disposed within the shaft.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The structure of a heater in accordance with the present invention is now described in greater detail, followed by a description of its operation and preferred manufacturing processes. The following description of the preferred embodiments is merely exemplary in nature and is in no way intended to limit the invention, its application, or uses.

Structure

Figure 1:
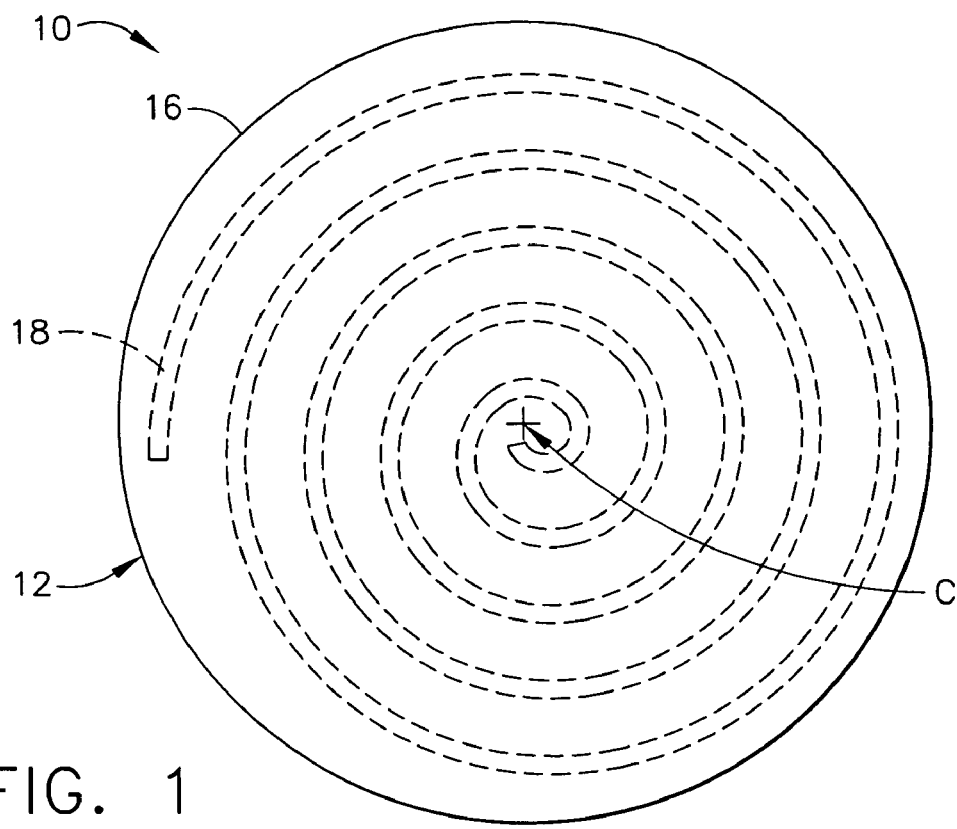
FIG. 1 is a top view of a heater in accordance with the teachings of the present invention.
Figure 2:
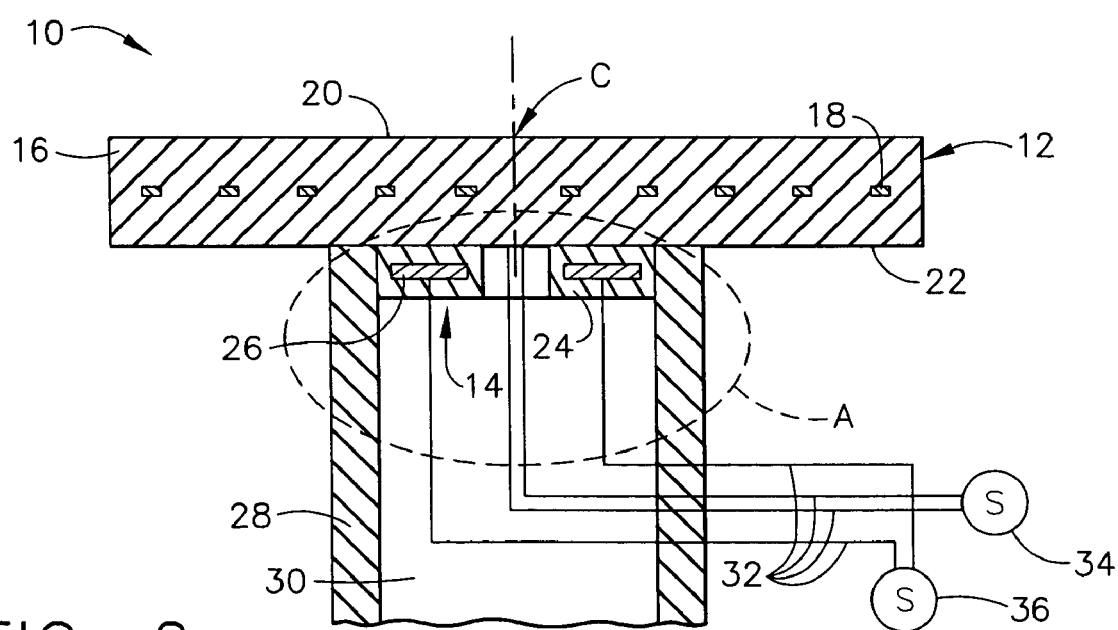
FIG. 2 is a side cross-sectional view of the heater in accordance with the teachings of the present invention.

Referring to FIGS. 1 and 2, a heater for wafer processing in accordance with the present invention is illustrated and generally indicated by reference numeral 10. The heater 10 in accordance with the present invention comprises a primary or first heating unit 12 and an auxiliary or second heating unit 14. The first heating unit 12 preferably defines a plate configuration and comprises a substrate 16 and a resistive heating element 18 (shown in dashed lines in FIG. 1) embedded within the substrate 16. The substrate 16 has a top surface 20 for supporting and heating a workpiece or a wafer (not shown) thereon, and a back surface 22 opposing the top surface 20. The first heating unit 12 constitutes the primary heating source for heating a workpiece or a wafer supported on the substrate 16.

The second heating unit 14 is disposed proximate the back surface 22 of the substrate 16 as shown in FIG. 2. The second heating unit 14 comprises a ceramic substrate 24 and a resistive heating element 26 embedded within the substrate 24. The second heating unit 14 serves as an auxiliary heating source and functions to compensate for the heat loss occurring on the top surface 20 of the substrate 16. Therefore, the second heating unit 14 contributes to a more uniform temperature distribution across the top surface 20. The operation of the second heating unit 14 to compensate for heat losses is described in greater detail below.

Preferably, the second heating unit 14 defines a ring shape as shown in FIG. 2. However, it should be understood that the substrate 24 of the second heating unit 14 can be made of any size and shape corresponding to the areas and amount of heat losses occurring at the top surface 20, while remaining within the scope of the present invention.

The substrate 16 of the first heating unit 12 and the substrate 24 of the second heating unit 14 are preferably made of ceramic materials including aluminum nitride (AlN), silicon nitride ($Si_3N_4$), aluminum oxide ($Al_2O_3$). Any materials with a good thermal conductivity and electrical insulation can be used as a substrate material without departing from the scope of this invention. The resistive heating element 18 of the first heating unit 12 is preferably made of Mo/AlN composite. It should be understood that other materials may be employed according to specific application requirements while remaining within the scope of the present invention.

Figure 3:
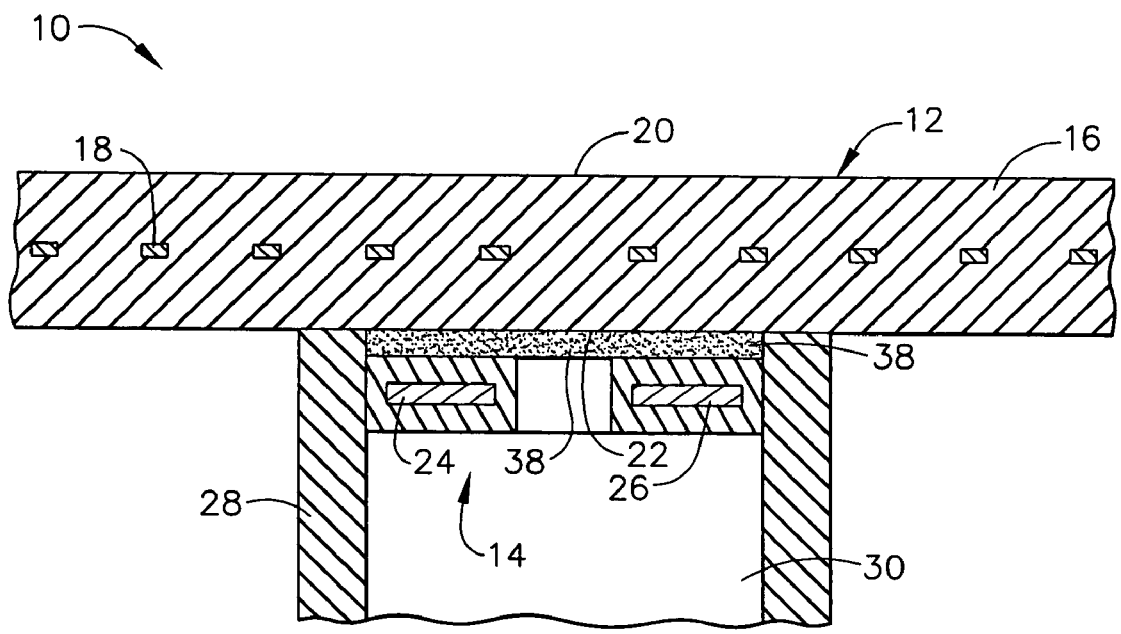
FIG. 3 is an enlarged side cross-sectional view of the heater, within detail A of FIG. 2, showing an attachment relationship among a primary heating unit, an auxiliary heating unit and a shaft in accordance with the teachings of the present invention.
Figure 4:
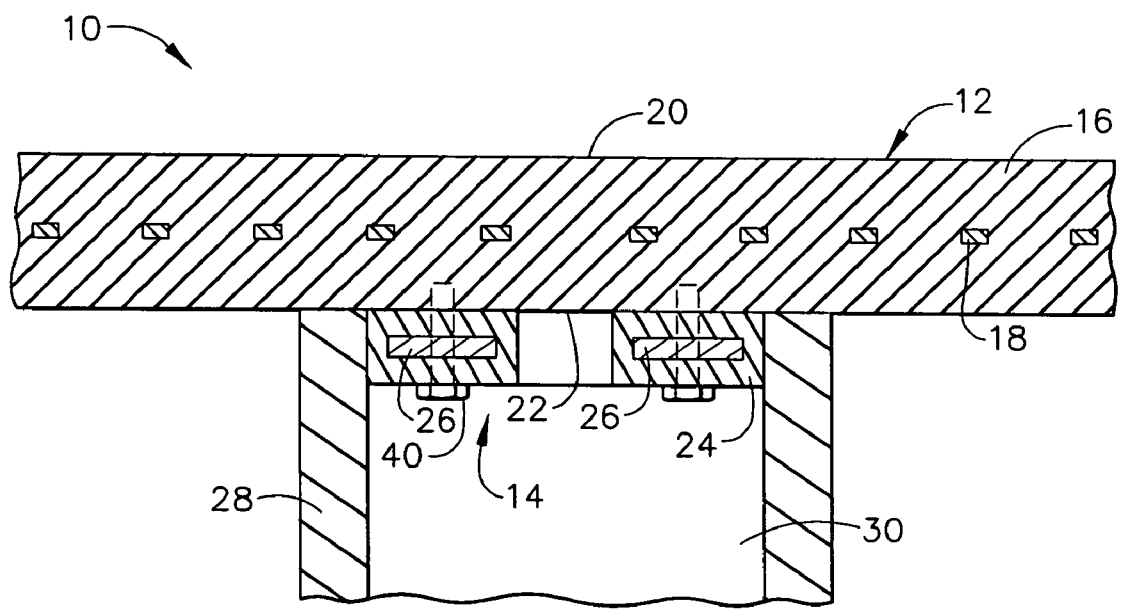
FIG. 4 is an enlarged side cross-sectional view of the heater, within detail A of FIG. 2, showing another embodiment of an attachment relationship among a primary heating unit, an auxiliary heating unit and a shaft in accordance with the teachings of the present invention.

Referring to FIGS. 2, 3, and 4, the second heating unit 14 is preferably proximate the back surface 22 of the substrate 16 of the first heating unit 12. While not necessary, it is preferred that the second heating unit 14 is bonded to the first heating unit 12 for optimum direct heat transfer from the second heating unit 14 to the first heating unit 12. In FIG. 3, the second heating unit 14 is shown to be attached to the back surface 22 of the first heating unit 12 by a chemical bonding method such as brazing or glass bonding wherein a bonding layer 38 is formed between the substrate 16 of the first heating unit 12 and the substrate 24 of the second heating unit 12. In FIG. 4, the second heating unit 14 is secured to the first heating unit 14 by a mechanical attachment method, such as by using rivets, screws, or bolts 40. If a mechanical attachment is used, the second heating unit 14 is replaceable when the second heating unit 14 degrades or for any reason cannot effectively compensate for the heat loss of the first heating unit 12 or correct the heating/temperature profile on the top surface 20.

The heater 10 further comprises a shaft 28 connected to the back surface 22 of the substrate 16 of the first heating unit 12. The shaft 28 is preferably joined to the substrate 16 of the first heating unit 12 by a direct joining method, as described in greater detail below, and supports the heater 10 inside a reaction chamber (not shown). The shaft 28 preferably comprises the same material as the substrates 16 and 24 of the first and the second heating units 12 and 14. It should be understood that other materials may be employed according to specific application requirements while remaining within the scope of the present invention.

The shaft 28 further defines an inner space 30 for receiving the second heating unit 14. The benefits of disposing the second heating unit 14 inside the inner space 30 are twofold. First, since a significant amount of heat loss occurs at the center area C as shown in FIGS. 1 and 2 where the shaft 28 is connected to the first heating unit 12, disposing the second heating unit 14 inside the inner space 30 of the shaft can more effectively compensate for the heat loss. Second, the shaft 28 shields the second heating unit 14 from the processing gases in the reaction chamber. Since the second heating unit 14 is not exposed to the processing gases, the second heating unit 14 does not require the use of corrosion-resistance material as a substrate material or additional corrosion-resistance treatment, thereby reducing the manufacturing costs.

Referring now to FIG. 2, the heater 10 in accordance with the present invention further comprises a first power supply 34 and a second power supply 36 for independently supplying electricity through lead wires 32 to the first heating unit 12 and the second heating unit 14, respectively. The lead wires 32 are preferably received inside the inner space 30 of the shaft 28 to avoid exposure of the lead wires 32 to the processing gases inside the wafer processing chamber.

Operation

Figure 5:
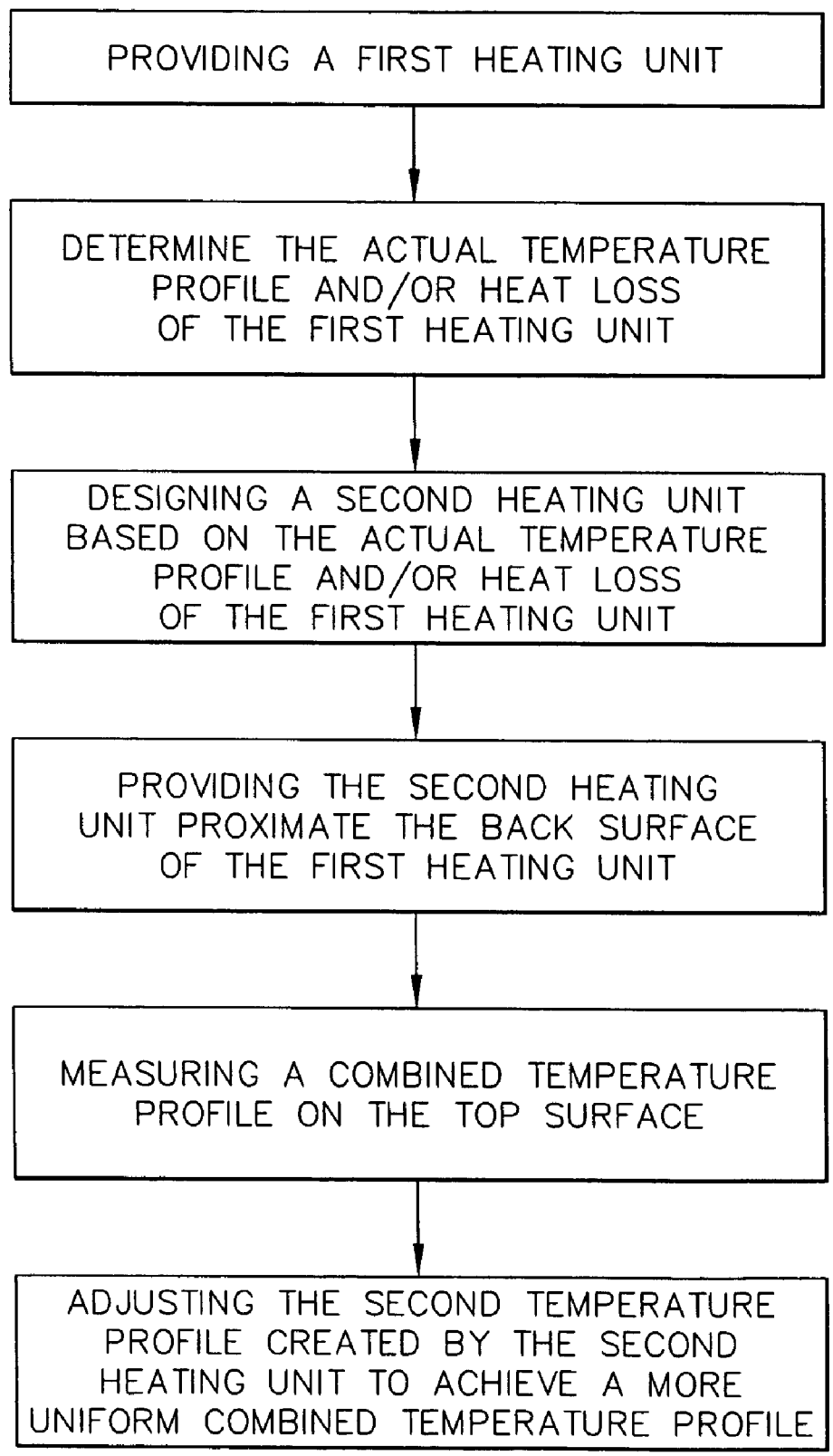
FIG. 5 is a schematic flow diagram of an operating process for operating a ceramic heater in accordance with the teachings of the present invention.

Referring to FIGS. 2 and 5, the operation of the heater 10 in accordance with the teachings of the present invention is now described in greater detail.

First, the first heating unit 12 functioning as the primary heating source is provided. The first heating unit 12 is operated and the temperature profile generated by the first heating unit 12 on the top surface 20 of the substrate 16 is measured according to those known in the art. Since how the temperature profile is measured is known in the art, the description thereof is omitted herein for clarity. If the temperature profile generated by the first heating unit 12 is not satisfactory, i.e., a uniform temperature profile across the top surface 20 is not achieved, a second heating unit 14 is then provided proximate the back surface of the substrate of the first heating unit at a region where heat loss is likely to occur. The second heating unit 14 then provides additional heat to the top surface 20 as necessary from the initial measured profile.

Generally, it has been found that the center area C as shown in FIGS. 1 and 2 of the top surface supporting a wafer thereon demonstrates the maximum heat loss during operation. Therefore, the second heating unit 14 is provided proximate the back surface 22 of the first heating unit 12 near this center area C where the shaft 28 is joined. Accordingly, the second heating unit 14 will generate another heating/temperature profile on the top surface 20 of the substrate 16 of the first heating unit 12. Importantly, the design of the second heating unit 14 is based on the actual measured temperature profile of the first heating unit 12 and the actual heat losses occurred. Therefore, the second heating unit 14 will be able to more effectively compensate for the heat loss and contributes to a more uniform temperature profile on the top surface 20.

Next, a combined heating/temperature profile across the top surface 20 of the substrate 16 of the first heating unit 12 is measured to determine whether the combined heating/temperature profile achieves a predetermined temperature profile, i.e., a more uniform temperature distribution, than without the second heating unit 14. The combined temperature profile is defined by a combination of the first temperature profile generated by the first heating unit 12 and the second temperature profile generated by the second heating unit 14. Since the first heating unit 12 and the second heating unit 14 are independently controlled, the second temperature profile generated by the second heating unit 14 can be easily adjusted to achieve a more uniform combined temperature profile across the top surface 20 of the substrate 16 of the first heating unit 12.

During this adjustment period, the second heating unit 14 is not permanently bonded to the first heating unit 12. Therefore, if the second heating unit 14, due to manufacturing deviations, cannot satisfactorily compensate for the heat loss, another second heating unit 14 with modified design specifications can be substituted to more effectively compensate for the heat loss.

When a satisfactory combined heating/temperature profile is achieved on the top surface 20 of the substrate 16 of the first heating unit 12, the second heating unit 14 can be permanently bonded to the first heating unit 12 by chemical methods or secured to the first heating unit 12 by mechanical attachment as previously described, thereby realizing a heater 10 with a more uniform heating/temperature profile.

Manufacturing Process

Figure 6:
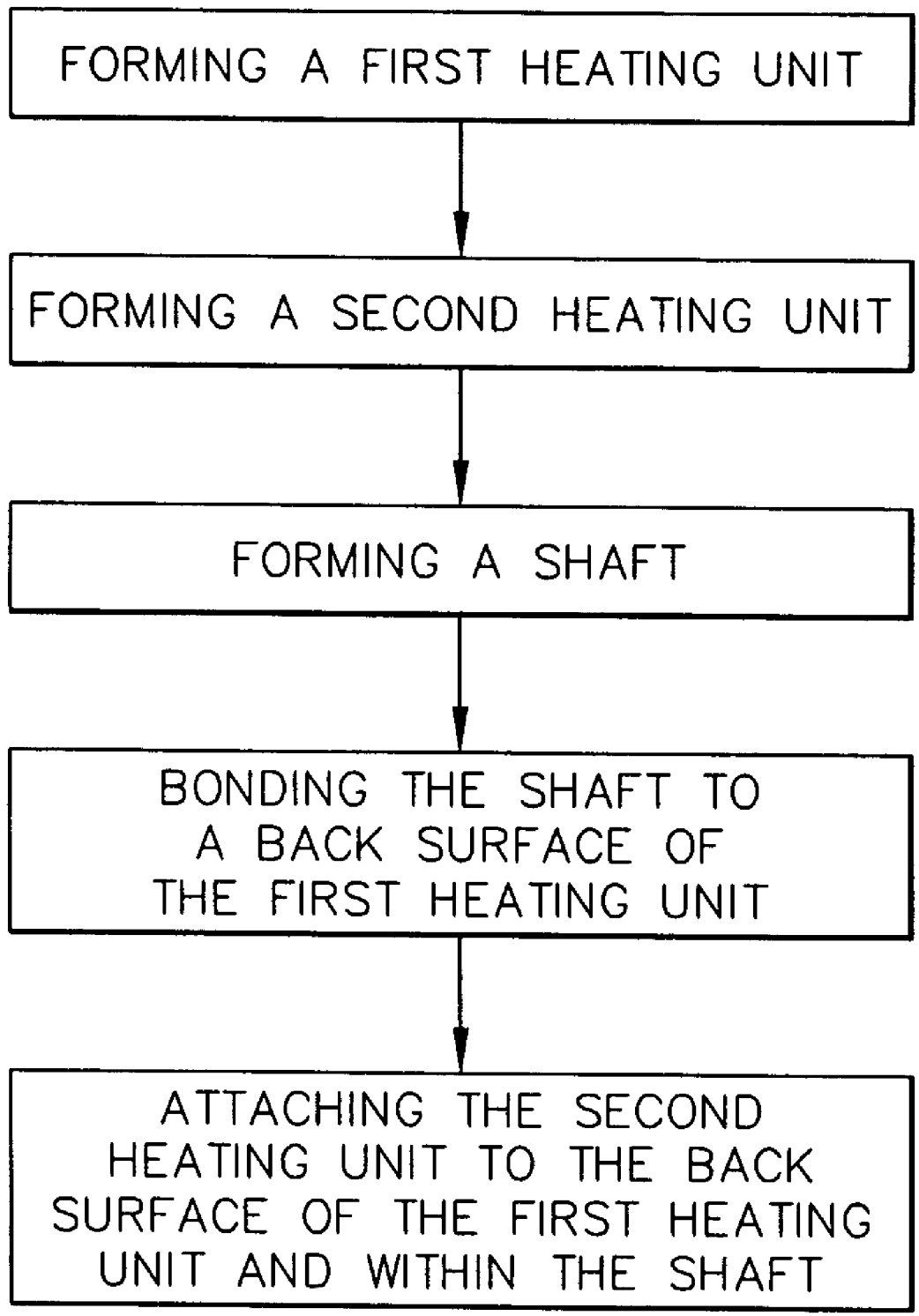
FIG. 6 is a schematic flow diagram of a manufacturing process for manufacturing a ceramic heater in accordance with the teachings of the present invention.

Referring to FIGS. 2 and 6, one preferred process of manufacturing the heater 10 in accordance with the present invention is now described in further detail. The first heating unit 12 and the second heating unit 14 are formed by a conventional method, such as hot pressing, with a resistive heating element embedded in a substrate. A method of using hot pressing to form a heating unit with an embedded heating element is described in U.S. Pat. No. 5,231,690, issued to Soma et. al and assigned to NGK Insulators, Japan, which is incorporated herein by reference in its entirety.

The resistive heating element 18 can be formed by any known method and material in the art. More specifically, the resistive heating element 18 can be made by embedding a metal coil or wire inside the substrate 16 as described in U.S. Pat. No. 5,231,690. The resistive heating element 18 can also be formed by layered technology, such as thick film, thin film, thermal spray and sol-gel, among others. Methods of forming a resistive heating element are described in U.S. Pat. No. 6,222,166 (thick film), U.S. Pat. No. 6,828,032 (thick film), U.S. Pat. No. 6,225,608 (thin film), U.S. Pat. No. 5,039,840 (thermal spray), U.S. Pat. No. 5,889,261 (thermal spray), U.S. Pat. No. 6,762,396 (thermal spray), U.S. Pat. No. 6,736,997 (sol-gel), which are all incorporated herein by reference in their entirety. Since providing a heating substrate with an embedded resistive heating element is known in the art, the details are omitted herein for clarity. Additionally, the pattern of the resistive heating element in the substrate can be designed in a way that suits the heating requirements and is not limited to the spiral or circular pattern shown in FIG. 1.

A shaft 28 for supporting the first heating unit 12 is then provided and formed by conventional sintering processes. An inner space 30 is formed in the shaft 28 and the shaft 28 is preferably made of AlN as previously described.

Next, the shaft 28 is joined to the substrate 16 of the first heating unit 12 by conventional joining methods. Preferably, the shaft 28 is joined to the substrate 16 by active alloy brazing or diffusion bonding at high temperature, as described in U.S. Pat. No. 6,066,836, issued to Chen et al. and assigned to Applied Materials, which is incorporated herein by reference in its entirety.

Then, the second heating unit 14 is secured to a back surface of the first heating unit 12 within the inner space of 30 of the shaft. The second heating unit 14 can be secured to the first heating unit by a brazing process, a glass bonding method, riveting, screwing or bolting as previously described.

The lead wires 32 connected to the resistive heating element 18 of the first heating unit 12 and the resistive heating element 26 of the second heating unit 14, respectively, are received in the inner space 30 of the shaft 28 and extend to outside of the reaction chamber for connecting a respective power supply. Preferably, temperature sensors or thermocouples (not shown) for measuring the temperature profile on the top surface 20 of the first heating unit are also received in the inner space 30 of the shaft 28. The method of connecting temperature sensors or thermal couples to a heating substrate is known in the art, as described in U.S. Pat. No. 6,066,836, and its description is omitted herein for clarity.

It should be noted that while the heater of the present invention has been described to achieve a more uniform heating/temperature profile, the present invention anticipates a heater with a designed non-uniform temperature profile, i.e. a customized temperature profile. Since the first and second heating units are independently controlled and the second heating unit is designed based on the actual temperature profile and heat loss on the top surface of the first heating unit, the same operating method for creating a uniform temperature profile can also be used to create a customized temperature profile.

It should be noted that while only one second heating unit 14 is described and illustrated, the present invention is not limited to a heater with only one second heating unit. More than one second heating unit can be used and independently controlled or controlled together to achieve a more uniform combined temperature profile on the heating surface of the substrate of the first heating unit without departing from the spirit and scope of the present invention. It is also within the contemplation of this invention that if multiple second heating units are used, some of the heating units can be in direct contact with the back surface of the substrate of the first heating unit, while others are not. It should also be noted that the second heating units can be provided at areas other than the center area of the substrate 16, depending on the predetermined heating profile (uniform or not-uniform) and the areas where the heat losses or hot spots actually occurred.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A heater comprising:
   a first heating unit comprising a substrate and a resistive heating element embedded in the substrate, the substrate having a heating surface for supporting a workpiece, a back surface, and a center area, the first heating unit generating a first temperature profile prior to operation of the heater; and
   a second heating unit external to the substrate and disposed proximate the back surface and the center area of the substrate,
   wherein prior to operation of the heater, the second heating unit is designed based on the first temperature profile of the first heating unit such that the second heating unit is designed to compensate for heat loss before operating the heater.

2. The heater according to claim 1, further comprising a shaft disposed proximate the back surface of the substrate, the shaft defining an inner space for receiving the second heating unit inside the shaft.

3. The heater according to claim 2, further comprising lead wires for electrically connecting at least one of the first and second heating units to a power supply and wherein the lead wires are received in the inner space of the shaft.

4. The heater according to claim 2, wherein the shaft defines a material comprising a ceramic material selected from the group consisting of aluminum nitride (AlN), silicon nitride ($Si_3N_4$), alumina ($Al_2O_3$).

5. The heater according to claim 2, wherein the shaft is joined to the substrate by active alloy brazing.

6. The heater according to claim 2, wherein the shaft is joined to the substrate by direct bonding between the substrate and the shaft at high temperature through a diffusion process.

7. The heater according to claim 1, wherein the second heating unit contacts the back surface of the substrate.

8. The heater according to claim 7, wherein the second heating unit is bonded to the back surface of the substrate by brazing, glass bonding or mechanical attachment.

9. The heater according to claim 1, wherein the second heating unit defines a ring shape.

10. The heater according to claim 1, further comprising a first power supply electrically connected to the first heating unit and a second power supply electrically connected to the second heating unit.

11. The heater according to claim 1, wherein the first heating unit is manufactured by hot pressing.

12. The heater according to claim 1, wherein the second heating unit comprises a resistive heating element embedded in a substrate.

13. The heater according to claim 12, wherein the resistive heating element of the second heating unit defines a composition comprising molybdenum (Mo) and aluminum nitride (AlN).

14. The heater according to claim 1, wherein the substrate defines a material comprising aluminum nitride (AlN).

15. The heater according to claim 1, wherein the resistive heating element defines a composition comprising molybdenum (Mo) and aluminum nitride (AlN).

16. A heater for wafer processing comprising:
    a first heating unit comprising a substrate and a resistive heating element embedded in the substrate, the substrate having a top surface, a back surface, and a center area, the first heating unit generating a first temperature profile prior to operation of the heater;
    a shaft disposed proximate the back surface and the center area of the substrate, the shaft defining an inner space; and
    a second heating unit external to the substrate and disposed proximate the back surface of the substrate and within the inner space of the shaft,
    wherein prior to operation of the heater, the second heating unit is designed based on the first temperature profile of the first heating unit such that the second heating unit is designed to compensate for heat loss before operating the heater.

17. The heater according to claim 16, wherein the substrate and the shaft define a material comprising aluminum nitride (AlN).

18. The heater according to claim 16, wherein the second heating unit comprises a resistive heating element embedded in a substrate.

19. The heater according to claim 18, wherein the resistive heating elements define a composition comprising molybdenum (Mo) and aluminum nitride (AlN).

20. A method of operating a heater for wafer processing, the method comprising the steps of:
    providing a first heating unit comprising a substrate and a first resistive heating element embedded in the substrate, the substrate having a top surface, a back surface, and a center area, the first resistive heating element generating a first temperature profile on the top surface prior to operation of the heater;
    providing a second heating unit external to the substrate and proximate the back surface and the center area of the substrate, the second heating element generating a second temperature profile on the top surface of the substrate prior to operation of the heater;
    measuring a combined temperature profile on the top surface of the substrate prior to operation of the heater, the combined temperature profile defined by a combination of the first temperature profile and the second temperature profile; and
    adjusting the second temperature profile to achieve a predetermined combined temperature profile on the top surface prior to operation of the heater.

21. The method according to claim 20, wherein the predetermined combined temperature profile is a uniform temperature profile.

22. The method according to claim 20, wherein the predetermined combined temperature profile is a non-uniform temperature profile.

23. The method according to claim 20, further comprising the step of determining an actual temperature profile on the top surface of the first heating unit and the step of designing the second heating unit based on the actual temperature profile of the first heating unit.

24. The method according to claim 20, wherein the second heating unit is disposed within a shaft proximate the back surface of the substrate.

25. The method according to claim 24, wherein the second heating unit provides additional heat to compensate for heat loss associated with the shaft.

26. A method of manufacturing a heater for wafer processing, the method comprising the steps of:
   forming a first heating unit by hot pressing, the first heating unit defining a resistive heating element embedded in a substrate;
   forming a second heating unit by hot pressing, the second heating unit defining a resistive heating element embedded in a substrate;
   forming a shaft by sintering; and
   bonding the shaft and the second heating unit to a back surface of the first heating unit, the second heating unit being disposed within the shaft.

27. The method according to claim 26, wherein the shaft is bonded to the first heating unit by a process selected from the group consisting of a brazing process and a diffusion process.

28. The method according to claim 26, wherein the second heating unit is bonded to the first heating unit by a brazing process.

29. The method according to claim 26, wherein the resistive heating elements define a composition comprising molybdenum (Mo) and aluminum nitride (AlN).

30. The method according to claim 26, wherein the substrates of the first and second heating element and the shaft define a material comprising aluminum nitride (AlN).

* * * * *